US010847917B2

(12) United States Patent
Ishida

(10) Patent No.: US 10,847,917 B2
(45) Date of Patent: Nov. 24, 2020

(54) ELECTRIC CONNECTOR AND ELECTRIC CONNECTOR SET

(71) Applicant: SMK Corporation, Tokyo (JP)

(72) Inventor: Yoshiyasu Ishida, Saitama (JP)

(73) Assignee: SMK Corporation, Tokyo (JP)

( * ) Notice: Subject to any disclaimer, the term of this patent is extended or adjusted under 35 U.S.C. 154(b) by 0 days.

(21) Appl. No.: 16/507,049

(22) Filed: Jul. 10, 2019

(65) Prior Publication Data

US 2020/0144754 A1 May 7, 2020

(30) Foreign Application Priority Data

Nov. 6, 2018 (JP) ................................ 2018-208990

(51) Int. Cl.
*H05K 1/00* (2006.01)
*H01R 13/426* (2006.01)
*H01R 12/71* (2011.01)

(52) U.S. Cl.
CPC ......... *H01R 13/426* (2013.01); *H01R 12/716* (2013.01)

(58) Field of Classification Search
CPC .... H01R 13/6594; H01R 12/52; H01R 13/41; H01R 12/716; H01R 13/426
USPC ...................................... 439/607.36, 74, 676
See application file for complete search history.

(56) References Cited

U.S. PATENT DOCUMENTS 6,503,101 B1 * 1/2003 Yu ...................... H01R 13/6597 439/607.36
8,888,506 B2 * 11/2014 Nishimura ......... H01R 12/7082 439/74
8,986,027 B2 * 3/2015 Nishimura ........... H01R 12/707 439/181
2005/0032400 A1 * 2/2005 Zhang .................... H01R 13/41 439/74
2005/0042924 A1 * 2/2005 Zhang ................ H01R 13/6582 439/607.36

(Continued)

FOREIGN PATENT DOCUMENTS

JP 2006331679 A 12/2006
JP 2016031842 A 3/2016

OTHER PUBLICATIONS

Office Action issued for counterpart Japanese Application No. 2018-208990, drafted by the Japan Patent Office dated Jun. 9, 2020.

*Primary Examiner* — Abdullah A Riyami
*Assistant Examiner* — Nelson R. Burgos-Guntin

(57) ABSTRACT

In the electric connector, a connector housing includes: a depressed fitting part; and a protruding fitting part provided inward of the depressed fitting part. The depressed fitting part and the protruding fitting part are capable of having protrusion-depression fits with a counterpart protruding fitting part provided in a ring shape on one side of a connector housing of a counterpart connector and a central depressed part provided inward of the counterpart protruding fitting part, respectively. The reinforcing metal piece to be attached to the connector housing includes a cover part for covering an end of the protruding fitting part from its upper surface side in a direction of the protrusion-depression fits over a width range equivalent to, or exceeding, a width, in a direction perpendicular to a row direction of the connection terminal row, of the protruding fitting part at the end thereof.

7 Claims, 12 Drawing Sheets

(56) References Cited

U.S. PATENT DOCUMENTS

| | | | | |
|---|---|---|---|---|
| 2006/0063432 | A1* | 3/2006 | Chen | H01R 13/658 439/607.36 |
| 2006/0264075 | A1 | 11/2006 | Obikane | |
| 2006/0276061 | A1* | 12/2006 | Koguchi | H01R 12/725 439/74 |
| 2008/0207014 | A1* | 8/2008 | Takeuchi | H01R 13/6275 439/74 |
| 2008/0305657 | A1* | 12/2008 | Midorikawa | H01R 4/028 439/74 |
| 2009/0061655 | A1* | 3/2009 | Miyazaki | H01R 12/57 439/74 |
| 2010/0068900 | A1* | 3/2010 | Wu | H01R 12/716 439/74 |
| 2011/0263140 | A1* | 10/2011 | Sato | H01R 12/7052 439/74 |
| 2013/0012039 | A1* | 1/2013 | Nose | H01R 12/716 439/74 |
| 2015/0079816 | A1* | 3/2015 | Suzuki | H01R 12/716 439/74 |
| 2015/0140840 | A1* | 5/2015 | Nishimura | H01R 12/79 439/74 |
| 2015/0140841 | A1* | 5/2015 | Watanabe | H01R 12/7011 439/74 |
| 2015/0207248 | A1* | 7/2015 | Takenaga | H01R 12/716 439/74 |
| 2016/0036145 | A1 | 2/2016 | Hasegawa | |
| 2016/0190719 | A1* | 6/2016 | Brzezinski | H01R 12/73 439/74 |
| 2020/0044374 | A1* | 2/2020 | Ishida | H01R 12/716 |

* cited by examiner

ELECTRIC CONNECTOR AND ELECTRIC CONNECTOR SET

CROSS REFERENCE TO RELATED APPLICATION

The contents of the following Japanese patent application are incorporated herein by reference.

Japanese Patent Application No. 2018-208990 filed on Nov. 6, 2018.

FIELD

The present invention relates to an electric connector and an electric connector set, and in particular, to a socket or plug type electric connector to be mounted on a circuit substrate and capable of having a protrusion-depression fit therebetween and an electric connector set including a socket and a plug.

BACKGROUND

Flat plate-shaped electric connectors to be mounted on substrates have been conventionally used in connectors for connecting flexible circuit substrates to circuit substrates, etc.

Electric connectors of this type include socket type electric connectors and plug type electric connectors. Such electric connectors can be implemented as an electric connector set in which a connector housing having a depressed fitting part in a socket type electric connector and a connector housing having a protruding fitting part in a plug type electric connector have protrusion-depression engagement in a face-to-face direction.

As a related electric connector set of this type, there has been known an electric connector set in which a metal reinforcing member (plug member) is provided in a protruding fitting part of a plug type electric connector and a metal reinforcing member (receptacle member) is provided in a depressed fitting part of a socket type electric connector in order to prevent the abrasion or breakage of their connector housings when fit and removal operations between the socket type electric connector and the plug type electric connector are repeated (see Patent Literature 1, for example).

CITATION LIST

Patent Literature

Patent Literature 1: Japanese Patent Application Laid-Open No 2006-331679.

SUMMARY

Technical Problem

The electric connector set described in Patent Literature 1, however, has a structure in which a receptacle member 141 provided in a depressed fitting part in a socket type electric connector has a gap between a first receptacle plate part 141a and a second receptacle plate part 141b at portions corresponding to the four corners of a protruding island member provided in the depressed fitting part of the electric connector.

Thus, in the related electric connector of this type, while the plug type electric connector is repeatedly fitted into, or removed from the socket type electric connector, the four corners of the protruding island member provided in the depressed fitting part of the socket type electric connector are abraded to produce floating waste. Such floating waste is more likely to cause contact failure as a result of being stuck between contacts, for example.

In view of the above, it is an object of the present invention to provide an electric connector and an electric connector set capable of avoiding the abrasion of a housing due to repeated fit and removal operations with a counterpart connector and thereby capable of preventing contact failure due to floating waste generated by the abrasion of the housing.

Solution to Problem

In order to achieve the aforementioned object, an electric connector of an aspect of the present invention includes: an insulating housing; a conductive connection terminal row provided in the housing; and a reinforcing metal piece attached to the housing. By means of a fit between the electric connector and a counterpart connector, the connection terminal row is electrically connected to a counterpart connection terminal row. The housing includes: a depressed fitting part provided in a ring shape on one side of the housing; and a protruding fitting part provided inward of the depressed fitting part. The depressed fitting part and the protruding fitting part are capable of having protrusion-depression fits with a counterpart protruding fitting part provided in a ring shape on one side of a counterpart housing of the counterpart connector and a counterpart depressed fitting part provided inward of the counterpart protruding fitting part, respectively. The reinforcing metal piece includes a cover part for covering an end of the protruding fitting part from its upper surface side in a direction of the protrusion-depression fits over a width range equivalent to, or exceeding, a width, in a direction perpendicular to a row direction of the connection terminal row, of the protruding fitting part at the end thereof.

With such a configuration, the cover part of the reinforcing metal piece in the electric connector of the aspect of the present invention functions to avoid, at the end of the protruding fitting part, interference by the counterpart protruding fitting part of the counterpart housing from the upper surface side and the width direction of the protruding fitting part when the counterpart connector is fitted into, or removed from, the electric connector of the aspect of the present invention. This can prevent the generation of floating waste due to the abrasion of the protruding fitting part in the housing even when the fit and removal operations are repeated, and can also reduce a risk of contact failure significantly.

In the electric connector of the aspect of the present invention, the reinforcing metal piece may further include a side cover portion extending from the cover part so as to cover a side surface of the end of the protruding fitting part.

With such a configuration, the electric connector of the aspect of the present invention can avoid, by means of the cover part and the side cover portion of the reinforcing metal piece, interference of the counterpart protruding fitting part against the protruding fitting part from its upper surface side and from the side surface of the protruding fitting part in the width direction when the counterpart connector is fitted into, or removed from, the electric connector of the aspect of the present invention. Consequently, the abrasion of the protruding fitting part in the housing due to the repeated fit and removal operations can be prevented from occurring more reliably, and a risk of contact failure can be further reduced.

In the electric connector of the aspect of the present invention, the cover part of the reinforcing metal piece may be configured to cover an entire end face of the protruding fitting part in the row direction of the connection terminal row.

With such a configuration, the electric connector of the aspect of the present invention can more reliably prevent the interference of the counterpart protruding fitting part against the protruding fitting part when the counterpart connector is fitted into, or removed from, the electric connector of the aspect of the present invention as compared to a configuration in which the cover part of the reinforcing metal piece covers only a portion of the end face of the protruding fitting part in the row direction of the connection terminal row. This can make the generation of floating waste and contact failure less likely to occur.

The electric connector of the aspect of the present invention may be configured in such a manner that: a plurality of connection terminal rows are arranged approximately in the same plane in the housing; the reinforcing metal piece is attached to the housing at each of both ends of the housing in the row direction of the connection terminal row; and each of both ends of the protruding fitting part in the row direction of the connection terminal row is covered with the cover part.

With such a configuration, regardless of from which side of the both ends of the counterpart protruding fitting part of the counterpart connector the fit or removal operation is started first, the electric connector of the aspect of the present invention can avoid the interference of the counterpart protruding fitting part against the both ends of the protruding fitting part by means of the cover part of the reinforcing metal piece provided on each side, thus preventing the generation of floating waste.

In order to achieve the aforementioned object, an electric connector set of an aspect of the present invention is configured to include an electric connector having the aforementioned configuration and the counterpart connector.

With such a configuration of the electric connector set of the aspect of the present invention, the cover part of the reinforcing metal piece in the electric connector capable of having protrusion-depression engagement with the counterpart connector functions to avoid, at the end of the protruding fitting part, interference by the counterpart protruding fitting part of the counterpart housing from the upper surface side and width direction of the protruding fitting part when the counterpart connector is fitted into, or removed from, the electric connector. This can prevent the generation of floating waste due to the abrasion of the protruding fitting part in the housing even when the fit and removal operations are repeated, and can also reduce a risk of contact failure significantly.

The aspects of the present invention can provide the electric connector and the electric connector set capable of avoiding the abrasion of the housing due to the repeated fit and removal operations with the counterpart connector and capable of preventing contact failure resulting from floating waste generated by the abrasion of the housing.

DESCRIPTION OF EMBODIMENTS

Embodiments of the present invention will be described below with reference to the drawings.

First Embodiment

FIGS. 1 to 10 show electric connectors according to a first embodiment of the present invention.

Mainly taking a socket-side electric connector 20A as an example, a configuration thereof will be described below. The present invention, however, can be applied also to a plug-side electric connector 30A.

As shown in FIGS. 1 to 3B, an electric connector set 10 according to the present embodiment includes the socket electric connector 20A and the plug electric connector 30A capable of having protrusion-depression engagement in their face-to-face direction.

A connector main body 20 of the electric connector 20A includes: a synthetic resin connector housing 21 injection-molded so as to have a depressed shape mainly on an upper surface side thereof and an approximately flat shape on a lower surface side thereof; rows of one of male and female connection terminals, e.g., conductive female connection terminal rows 22*a* and 22*b* that are arranged approximately in the same plane (in a coplanar fashion) in the synthetic resin (insulating) connector housing 21; and reinforcing metal pieces 24 attached to the connector housing 21.

As shown in FIGS. 1, 2A, 2B, 5A and 5B, the connector housing 21 includes: a depressed fitting part 21*a* provided on one side surface (the aforementioned upper surface side) so as to form a rectangular ring-shaped groove, for example; a protruding fitting part 21*b* provided in a protruding manner in a central part of the surface on which the depressed fitting part 21*a* is provided and having rows of terminal insertion parts 21*h* and 21*i* arranged along the groove shape of the depressed fitting part 21*a*; a substrate facing surface 21*c* (see FIGS. 2B and 5B) to face a circuit substrate P (see FIG. 1); and terminal attachment holes 21*d* (see FIGS. 2B and 5B) to which connection terminals constituting the connection terminal rows 22*a* and 22*b* are attached. The connector housing 21, the depressed fitting part 21*a*, and the protruding fitting part 21*b* correspond to an exemplary housing, an exemplary depressed fitting part, and an exemplary protruding fitting part in the present invention, respectively.

Figure 1:
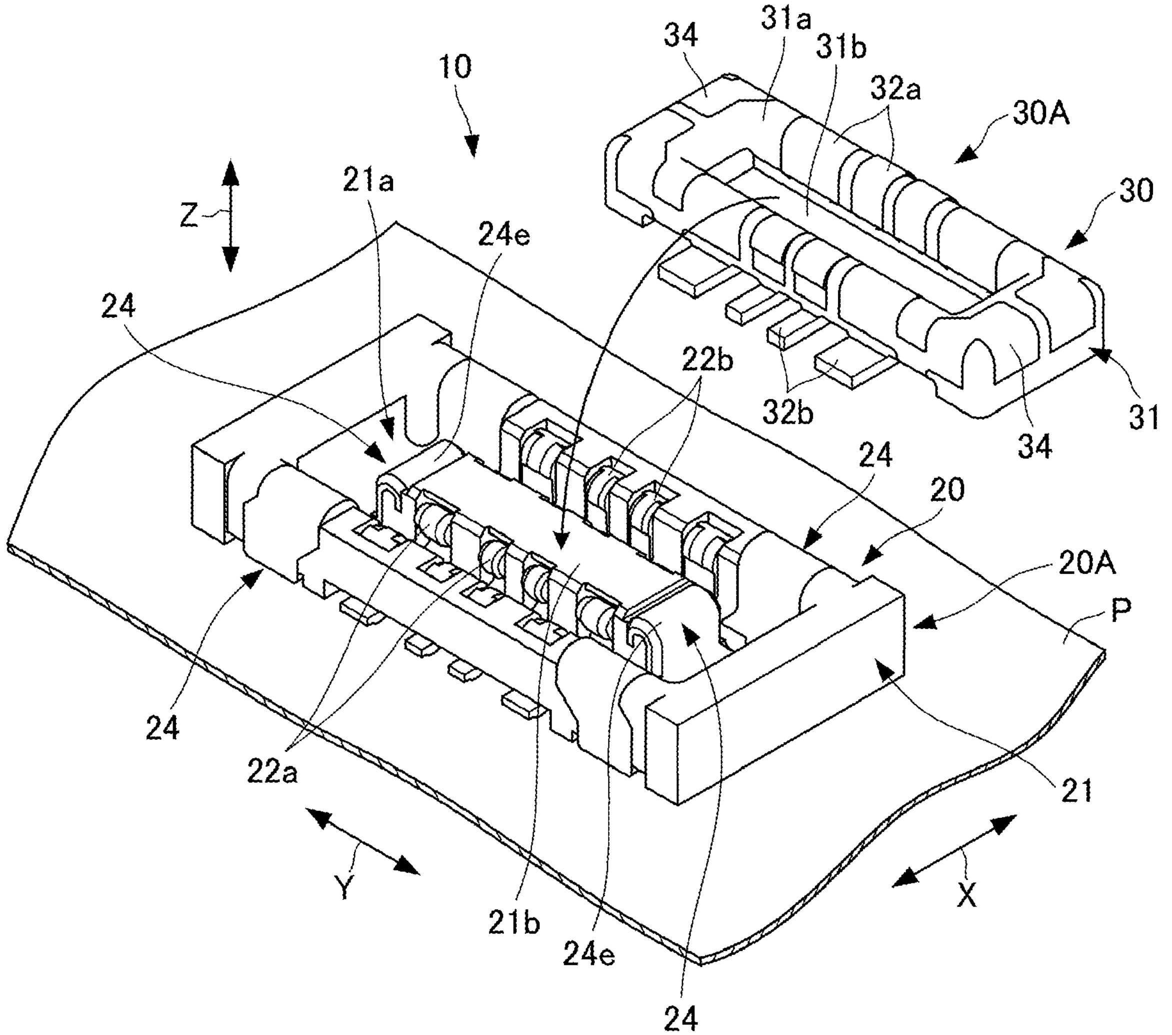
FIG. 1 is an exploded perspective view of an electric connector set according to a first embodiment of the present invention.

With the X direction in FIG. 1 being defined as a row width direction, the plurality of connection terminal rows 22*a* and 22*b* are receptacle contacts fitted into the terminal insertion parts 21*h* and 21*i* through the plurality of terminal attachment holes 21*d* of the connector housing 21. The plurality of connection terminal rows 22*a* and 22*b* are held by the connector housing 21 so as not to come out from the connector housing 21.

Figure 3A:
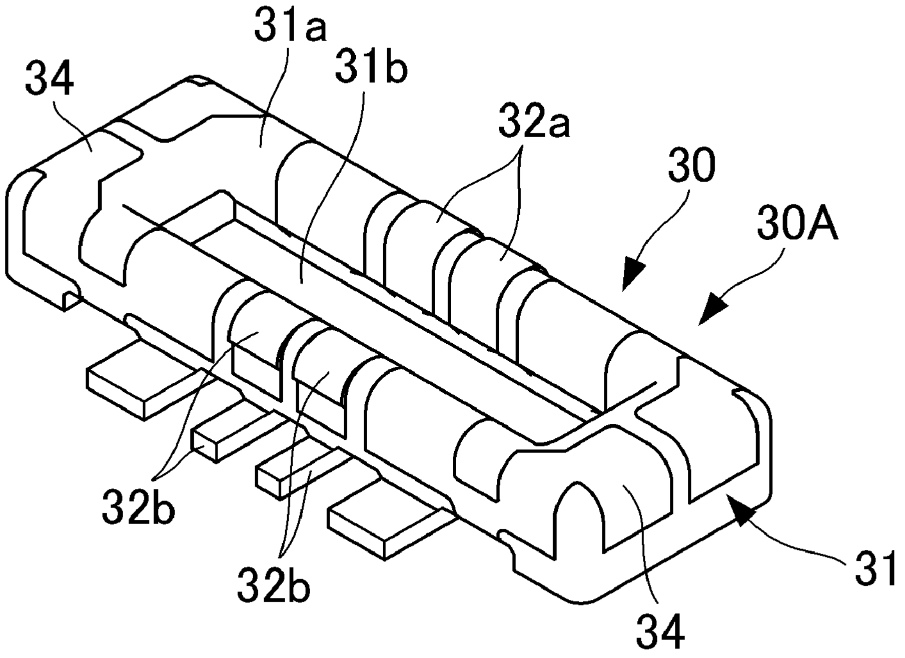
FIG. 3A is an exterior perspective view of an electric connector (plug) according to the first embodiment of the present invention, showing the exterior of its lower surface side having a protruding shape.
Figure 3B:
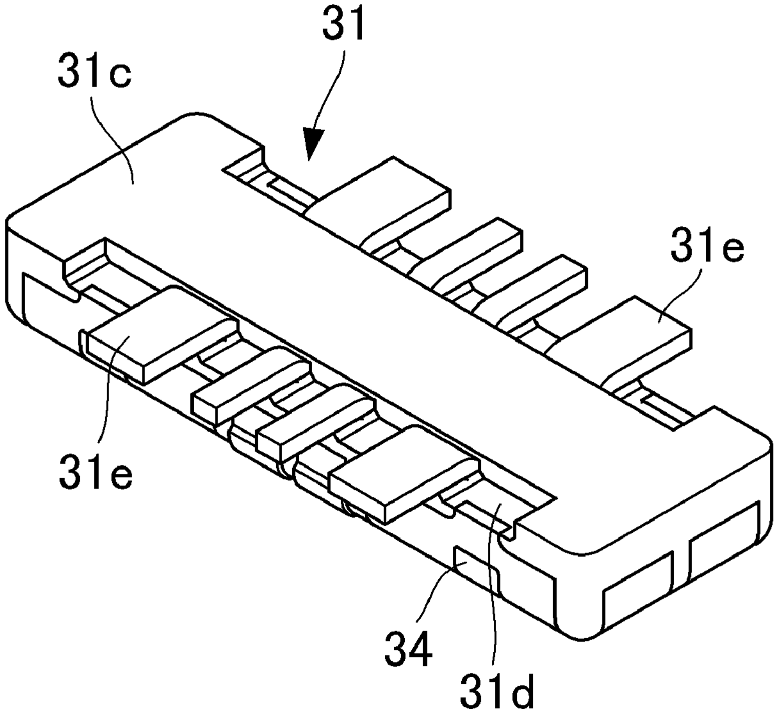
FIG. 3B is an exterior perspective view of the electric connector (plug) according to the first embodiment of the present invention, showing the exterior of its upper surface side.

As shown in FIGS. 1, 3A and 3B, a connector main body 30 of the counterpart electric connector 30A includes: a connector housing 31 having a protruding shape mainly on one surface side thereof; rows of the other one of the male and female connection terminals, e.g., male connection terminal rows 32*a* and 32*b* that are disposed in a coplanar fashion in the connector housing 31; and reinforcing metal pieces 34 attached to the connector housing 31.

The connector housing 31 includes: a protruding fitting part 31*a* in the shape of a rectangular ring-shaped protrusion, for example; a central depressed part 31*b* located inward of the protruding fitting part 31*a*; an upper surface cover part 31*c* (see FIG. 3B) extending along an upper surface 31*d* of the connector housing 31 over an entire area of the connector housing 31 in the longitudinal direction thereof; and pairs of attachment and detachment operation parts 31*e* (see FIG. 3B) provided so as to extend on the upper surface side of the connector housing 31. The connector housing 31, the protruding fitting part 31*a*, and the central depressed part 31*b* correspond to an exemplary counterpart housing, an exemplary counterpart protruding fitting part, and an exemplary counterpart depressed fitting part in the present invention, respectively. As just described, the connector housing 21 and the connector housing 31 in the present embodiment are distinguished as the exemplary housing and the exemplary counterpart housing of the present invention; the depressed fitting part 21*a* and the central depressed part 31*b* as the exemplary depressed fitting part and the exemplary counterpart depressed fitting part of the present invention; and the protruding fitting part 21*b* and the protruding fitting part 31*a* as the exemplary protruding fitting part and the exemplary counterpart protruding fitting part of the present invention.

The depressed fitting part 21*a* in the connector housing 21 of the electric connector 20A and the protruding fitting part 31*a* in the connector housing 31 of the counterpart electric connector 30A each have a rectangular ring shape in FIGS. 1 to 3B. The depressed fitting part 21*a* and the protruding fitting part 31*a*, however, are not limited to a rectangular ring shape but may have any ring shape.

The plurality of connection terminal rows 32*a* and 32*b* are plug contacts integrally attached to the protruding fitting part 31*a* of the connector housing 31, and their outer edges are arranged in parallel with each other. While not shown in FIG. 1, the connection terminal rows 32*a* and 32*b* in the electric connector 30A may be configured in such a manner that portions of the connection terminal rows 32*a* and 32*b* extended to the side of the upper surface cover part 31*c* (see FIG. 3B) are connected to a wiring pattern of a circuit substrate different from the circuit substrate P shown in FIG. 1.

As shown in FIGS. 1 to 3B, the connector main body 20 of the electric connector 20A and the connector main body 30 of the counterpart electric connector 30A are provided with the conductive reinforcing metal pieces 24 and 34, respectively. The reinforcing metal pieces 24 and 34 have shapes corresponding to a part of an inner surface of the aforementioned depressed fitting part 21*a* and a part of an outer surface of the protruding fitting part 31*a*, respectively. The reinforcing metal pieces 24 and 34 are produced by subjecting a sheet metal to press work so as to have predetermined shapes including the shape of the part of the inner surface of the depressed fitting part 21*a* and the shape of the part of the outer surface of the protruding fitting part 31*a*.

A configuration of the reinforcing metal piece 24 in the electric connector 20A will be described next in more detail.

Figure 5A:
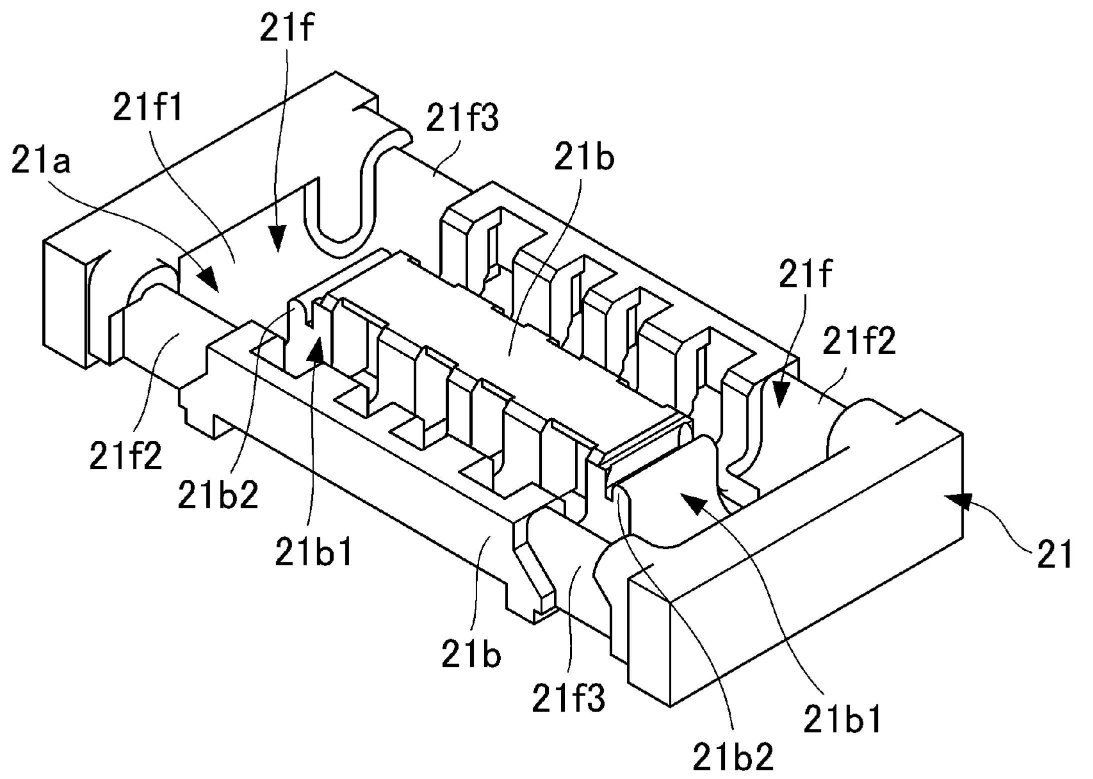
FIG. 5A is a perspective view of a connector housing in the electric connector (socket) according to the first embodiment of the present invention when no reinforcing metal pieces and connection terminal rows are attached thereto, showing the exterior of its upper surface side.
Figure 5B:
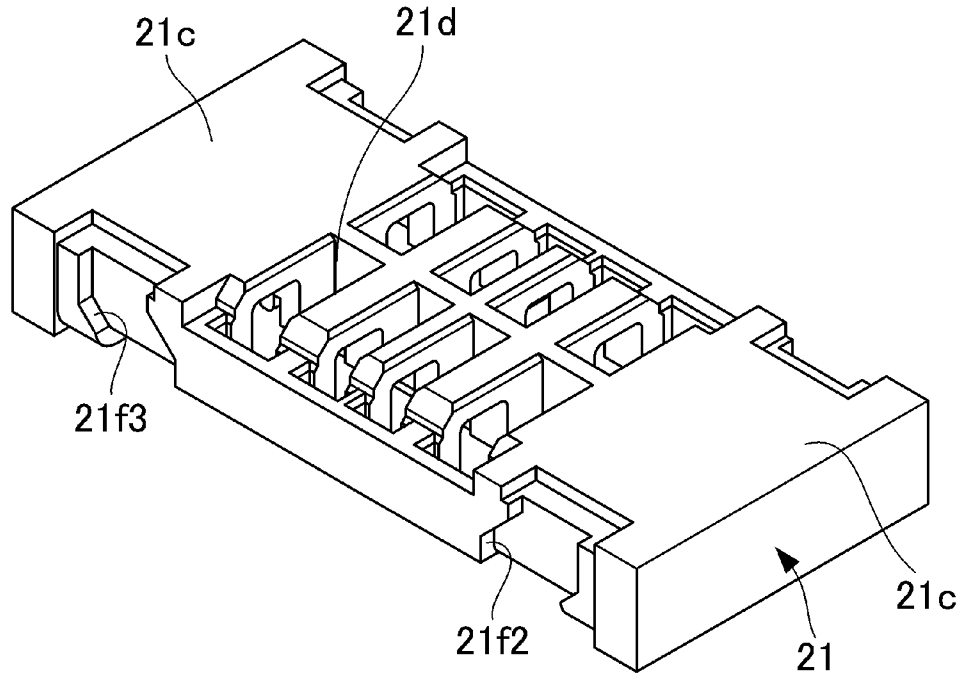
FIG. 5B is a perspective view of the connector housing in the electric connector (socket) according to the first embodiment of the present invention when no reinforcing metal pieces and connection terminal rows are attached thereto, showing the exterior of its lower surface side.
Figure 6A:
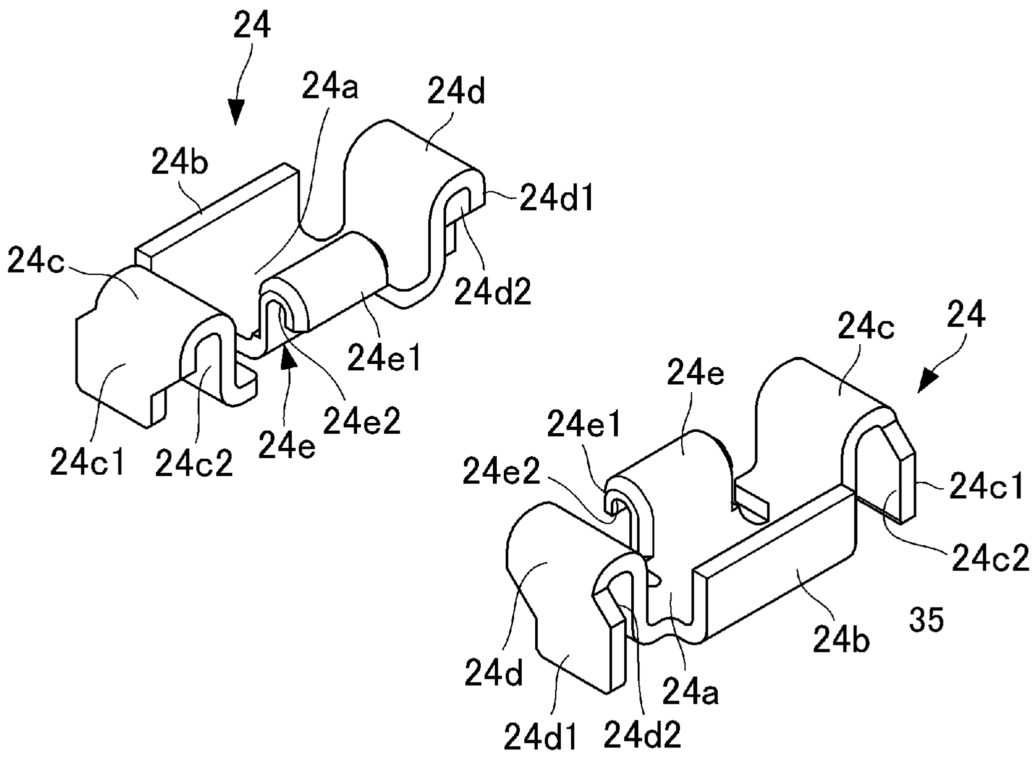
FIG. 6A is a perspective view of the reinforcing metal pieces to be attached to the connector housing in the electric connector (socket) according to the first embodiment of the present invention, showing the exterior of its upper surface side.
Figure 6B:
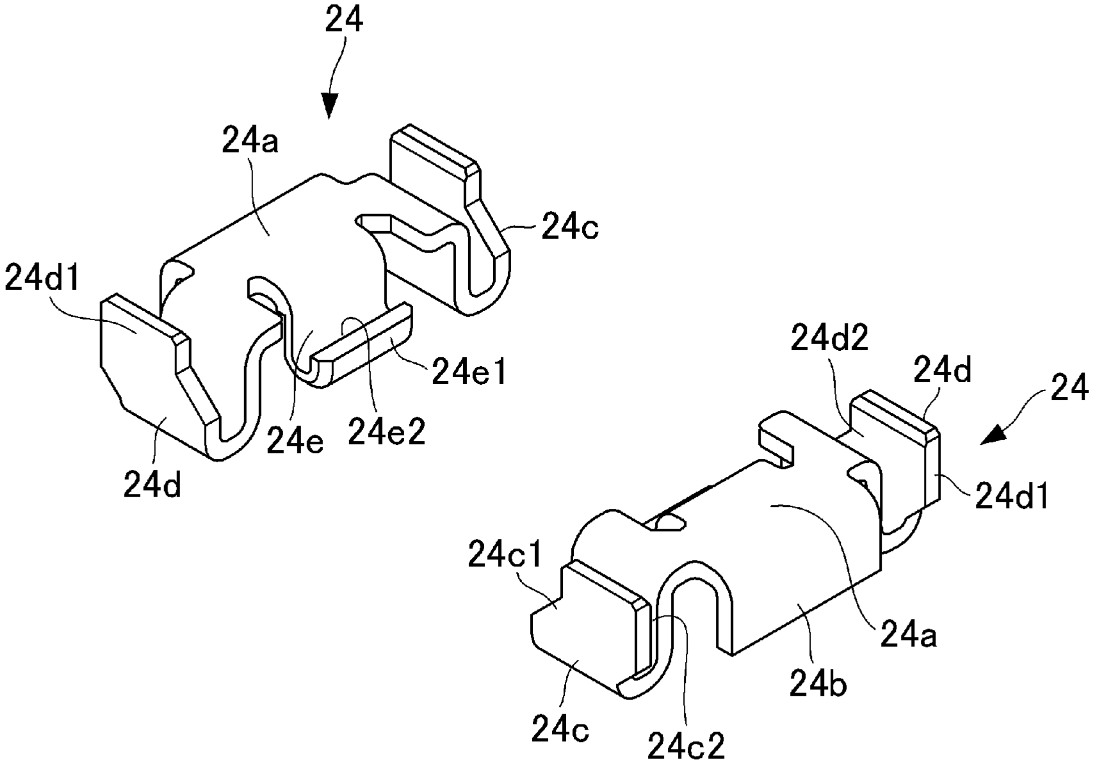
FIG. 6B is a perspective view of the reinforcing metal pieces to be attached to the connector housing in the electric connector (socket) according to the first embodiment of the present invention, showing the exterior of its lower surface side.

FIGS. 6A and 6B are perspective views showing the reinforcing metal pieces 24 to be attached to the connector housing 21 of the electric connector 20A according to the present embodiment. FIG. 6A shows the exterior of the upper surface side of the reinforcing metal pieces 24, and FIG. 6B shows the exterior of the lower surface side of the reinforcing metal pieces 24. The two reinforcing metal pieces 24 are shown in FIGS. 6A and 6B with the same disposition as the two reinforcing metal pieces 24 in an exploded perspective view of the electric connector 20A shown in FIG. 4. As can be seen also from the structures shown in FIGS. 1, 2A, 2B, 4, 5A and 5B, the two reinforcing metal pieces 24 are attached to the connector housing 21 in the connector main body 20 of the electric connector 20A from its outer sides in the row direction of the connection terminal rows 22*a* and 22*b*.

In consideration of the definitions on the directions of X, Y, and Z in FIG. 1, each of the two reinforcing metal pieces 24 shown in FIGS. 6A and 6B includes: a rectangular base part 24*a* having a flat surface parallel to the X-Y plane in FIG. 1; side edge plates 24*b*, 24*c*, and 24*d* extending, in a direction (the Z direction in FIG. 1) along which fit and removal operations between the electric connectors 20A and 30A are performed, from three adjacent side edges of the base part 24*a* excluding a side edge of the base part 24*a* closer to the protruding fitting part 21*b*; and a cover part 24*e* extending in the above-described fit and removal direction from the side edge of the base part 24*a* closer to the protruding fitting part 21*b*.

In the reinforcing metal piece 24, the side edge plate 24*b* comprises a rectangular flat plate member having a predetermined height smaller than the side edge plates 24*c* and 24*d* and the cover part 24*e* in the fit and removal direction. The side edge plate 24*b* functions as one of engagement protruding parts to be engaged with reinforcing metal piece engagement parts 21*f* provided at ends of the connector housing 21 in the row direction of the connection terminal rows 22*a* and 22*b*.

Figure 4:
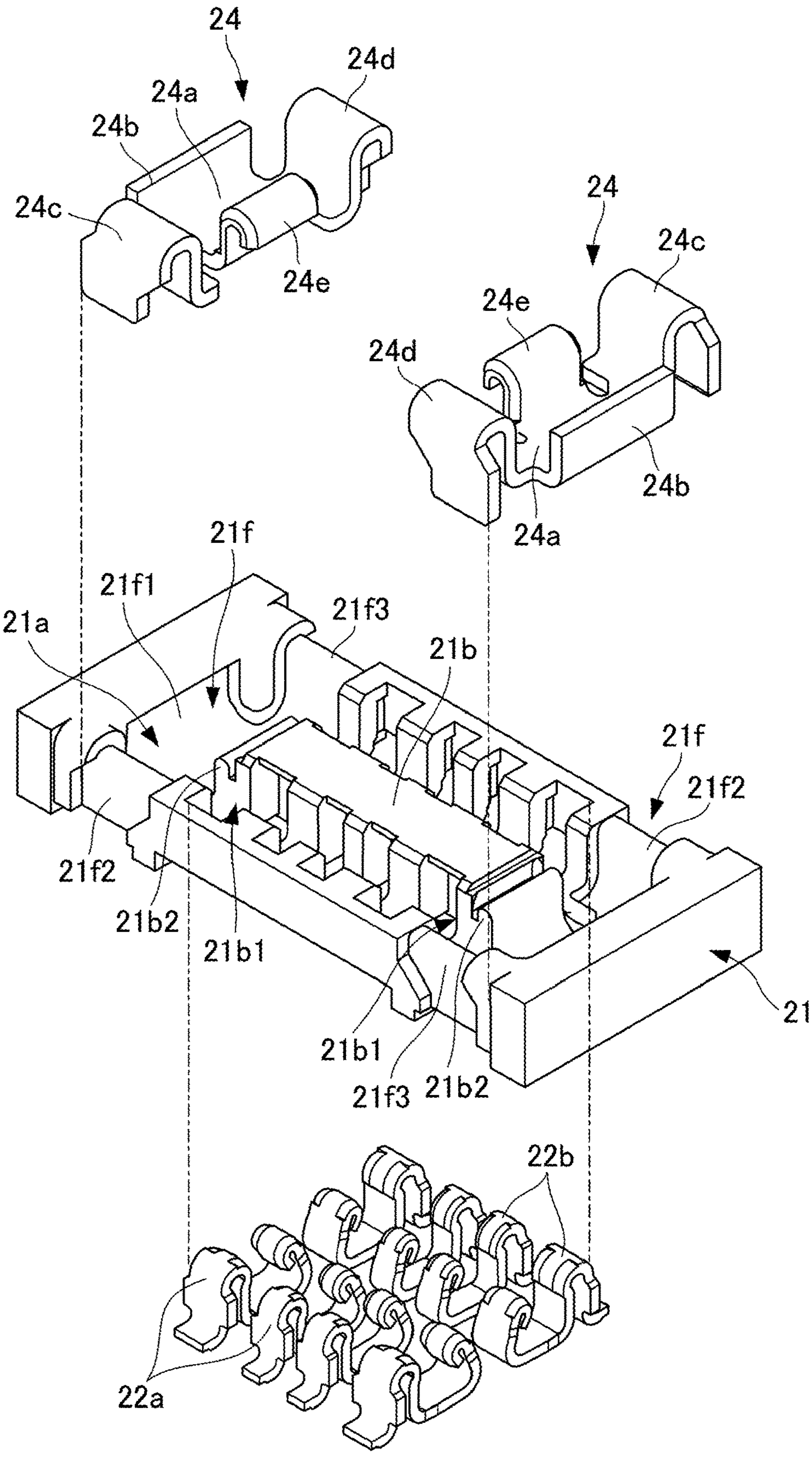
FIG. 4 is an exploded perspective view of the electric connector (socket) according to the first embodiment of the present invention.

The reinforcing metal piece engagement part 21*f* of the connector housing 21 includes: an engagement depressed portion 21*f*1 provided on an outward side in the row direction of the connection terminal rows 22*a* and 22*b*; and engagement depressed portions 21*f*2 and 21*f*3 provided at ends in the row width direction of the connection terminal rows 22*a* and 22*b* as shown in FIGS. 4 and 5A, for example. The aforementioned side edge plate 24*b* of the reinforcing metal piece 24 is configured to engage with the engagement depressed portion 21*f*1 of the reinforcing metal piece engagement part 21*f*.

In the reinforcing metal piece 24, the side edge plates 24*c* and 24*d* have curved extended parts 24*c*1 and 24*d*1 protruding outward in the row width direction of the connection terminal rows 22*a* and 22*b* at a position higher than the side edge plate 24*b* in the fit and removal direction and folded back outward of bases of the side edge plates 24*c* and 24*d*. The extended parts 24*c*1 and 24*d*1 form grooves 24*c*2 and 24*d*2 having openings between terminations of the extended parts 24*c*1 and 24*d*1 and unfolded portions of the side edge plates 24*c* and 24*d* (the bases of the side edge plates 24*c* and 24*d*).

The grooves 24*c*2 and 24*d*2 function as engagement protruding parts to engage with the engagement depressed portions 21*f*2 and 21*f*3, respectively, of the reinforcing metal piece engagement part 21*f* (see FIGS. 4 and 5A) in the connector housing 21.

In the reinforcing metal piece 24, the cover part 24*e* includes a curved extended portion 24*e*1 protruding in a direction opposite to the side edge plate 24*b* at a height position equivalent to the side edge plates 24*c* and 24*d* in the fit and removal direction and folded back outward of a base of the cover part 24*e*. The extended portion 24*e*1 forms a groove 24*e*2 having an opening between a termination of the extended portion 24*e*1 and an unfolded portion of the cover part 24*e* (the base of the cover part 24*e*).

The grooves 24*e*2 formed in the cover parts 24*e* of the reinforcing metal pieces 24 function as engagement protruding parts to engage with edge engagement portions 21*b*1 provided at both ends of the protruding fitting part 21*b* of the connector housing 21 in the row direction of the connection terminal rows 22*a* and 22*b*. Note that the edge engagement portion 21*b*1 of the protruding fitting part 21*b* includes an engagement protrusion 21*b*2 capable of receiving the groove 24*e*2 as shown in FIGS. 4 and 5A. The reinforcing metal pieces 24 are configured to cover the both ends of the protruding fitting part 21*b* in the row direction of the connection terminal rows 22*a* and 22*b* with the groove 24*e*2 being engaged with the engagement protrusion 21*b*2 by means of the cover part 24*e*.

Figure 2A:
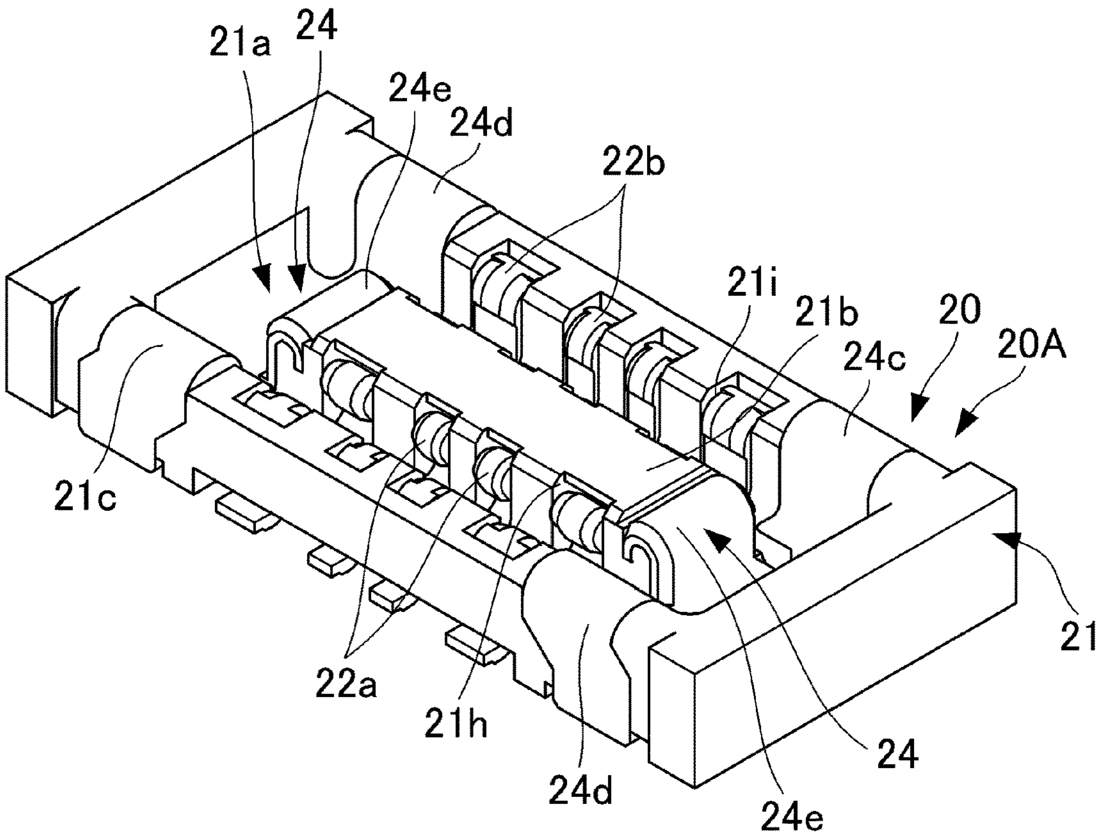
FIG. 2A is an exterior perspective view of an electric connector (socket) according to the first embodiment of the present invention, showing the exterior of its upper surface side.
Figure 2B:
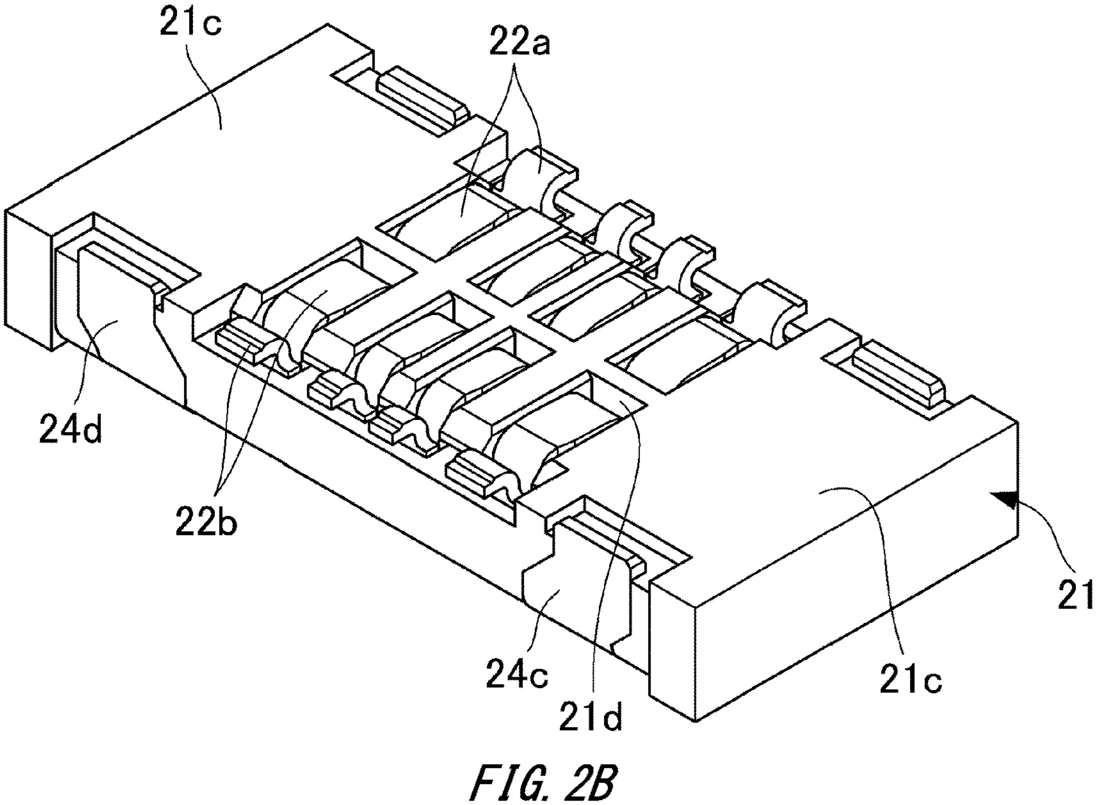
FIG. 2B is an exterior perspective view of the electric connector (socket) according to the first embodiment of the present invention, showing the exterior of its lower surface side.
Figure 7A:
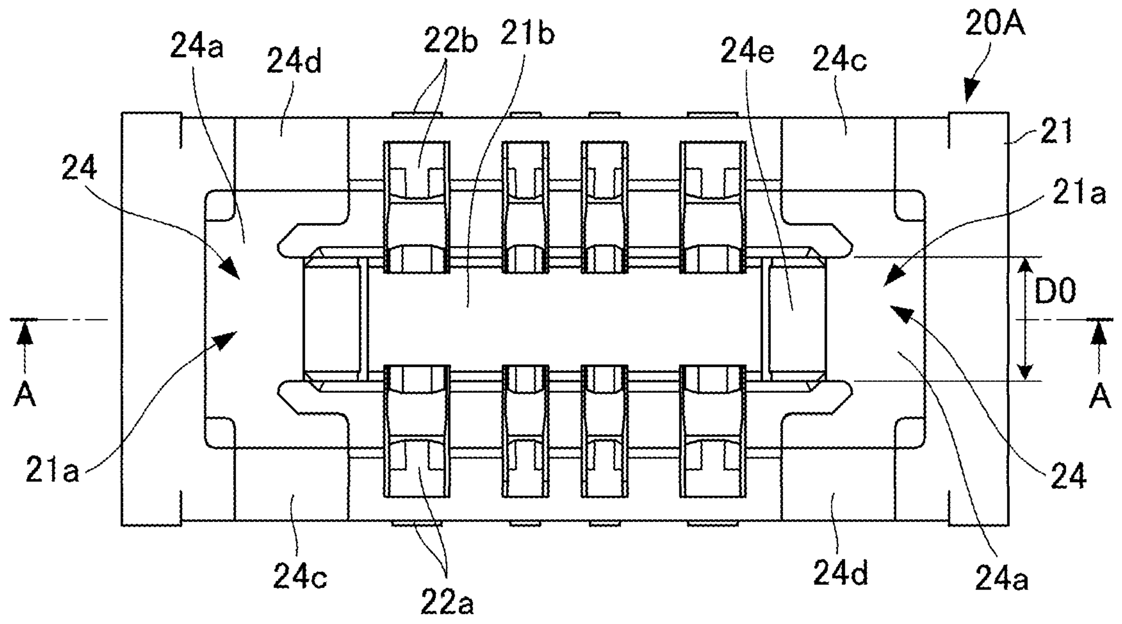
FIG. 7A is an exterior configuration diagram of the electric connector (socket) according to the first embodiment of the present invention, showing a plan view thereof.
Figure 7B:
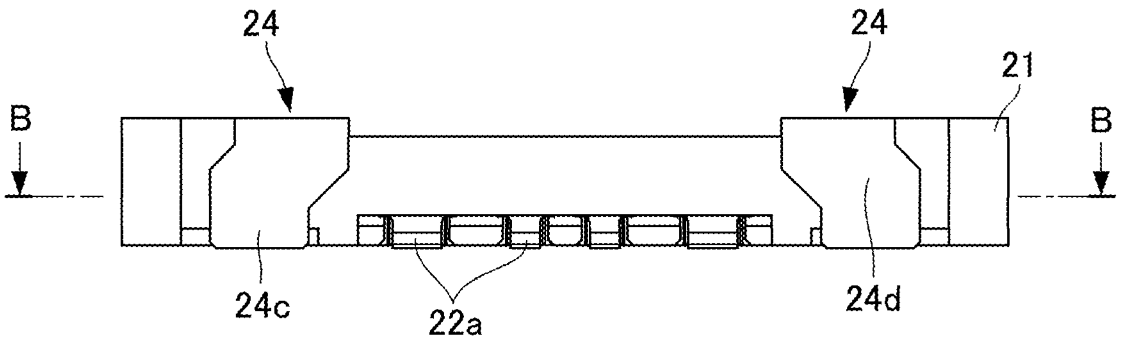
FIG. 7B is an exterior configuration diagram of the electric connector (socket) according to the first embodiment of the present invention, showing a side view thereof as viewed from the lower side of FIG. 7A.

In the reinforcing metal piece 24 shown in FIGS. 6A and 6B, a width of the cover part 24*e*, for example, in a direction (the X direction in FIG. 1) perpendicular to the row direction of the connection terminal rows 22*a* and 22*b* is equivalent to a width (row width), in the same direction, of the protruding fitting part 21*b* at the both ends thereof in the row direction of the connection terminal rows 22*a* and 22*b* (see FIGS. 1, 2A, and 7A).

A mode for mounting the reinforcing metal pieces 24 having the above-described configuration on the connector housing 21 will be described next. As can be seen also from the exploded perspective view shown in FIG. 4, the electric connector 20A according to the present embodiment is assembled by attaching the reinforcing metal pieces 24 to the reinforcing metal piece engagement parts 21*f* of the connector housing 21 and the edge engagement portions 21*b*1 (see FIGS. 1, 2A, and 5A) at the both ends of the protruding fitting part 21*b*, and by attaching (inserting), from the underneath of the connector housing 21, the connection terminals to (into) the terminal attachment holes 21*d* (see FIGS. 2B and 5B) of the connector housing 21.

Figure 8A:
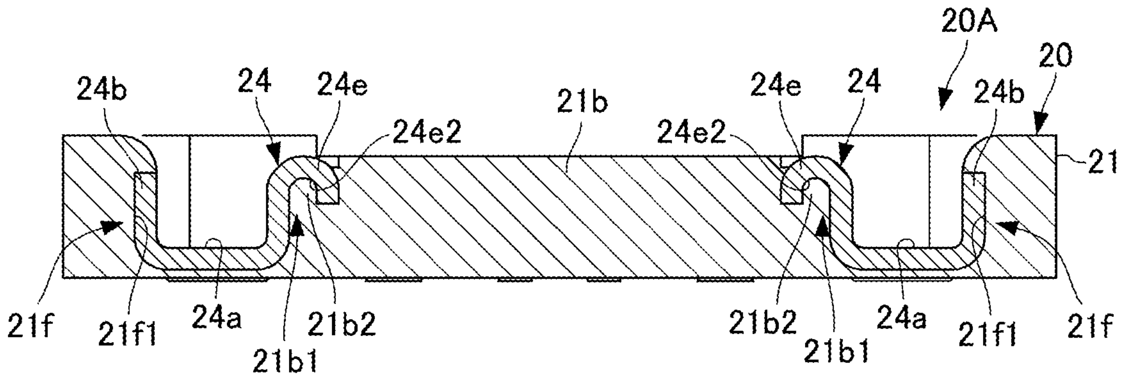
FIG. 8A is a cross-sectional view of the electric connector (socket) according to the first embodiment of the present invention, showing a cross-sectional view taken along line A-A in FIG. 7A.
Figure 8B:
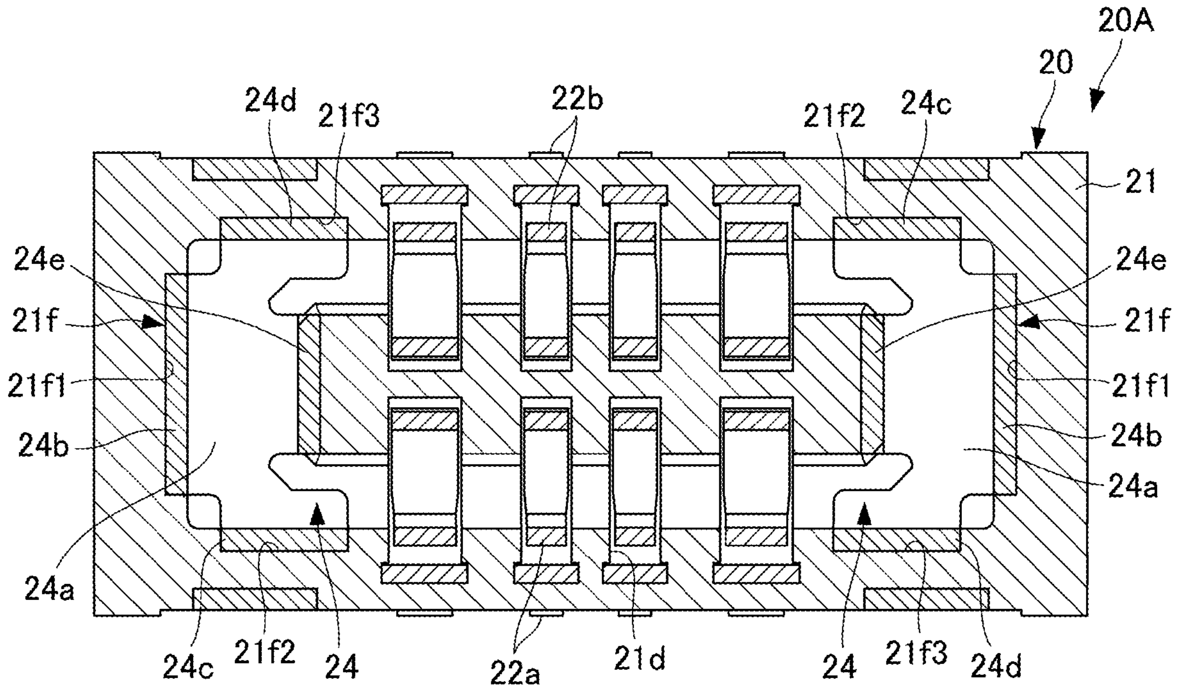
FIG. 8B is a cross-sectional view of the electric connector (socket) according to the first embodiment of the present invention, showing a cross-sectional view taken along line B-B in FIG. 7B.
Figure 9:
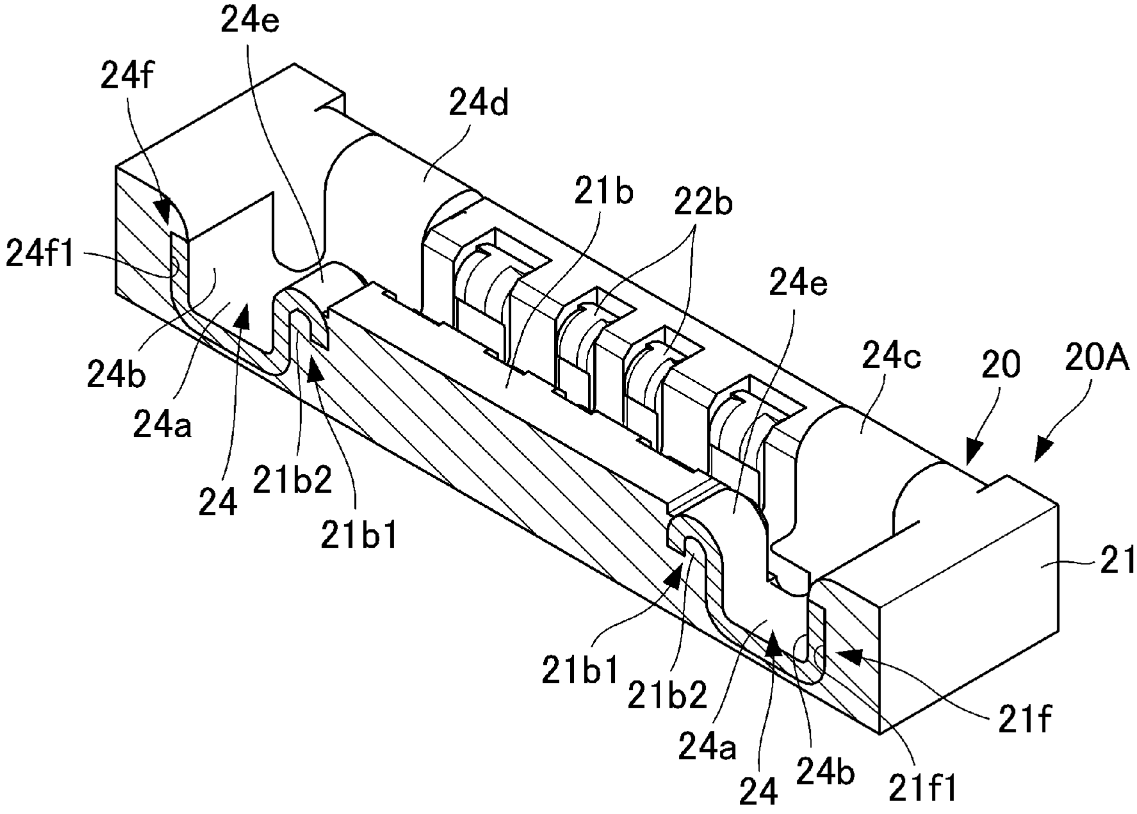
FIG. 9 is a perspective view including a vertical cross section of the electric connector (socket) according to the first embodiment of the present invention in a longitudinal direction thereof.

The thus assembled electric connector 20A has the exterior structure shown in FIGS. 1, 2A, 2B, 7A and 7B. In the electric connector 20A, the side edge plate 24*b* of the reinforcing metal piece 24 engages with the engagement depressed portion 21*f*1 of the reinforcing metal piece engagement part 21*f* in the connector housing 21 as shown in FIGS. 8A, 8B and 9, for example. The side edge plates 24*c* and 24*d* of the reinforcing metal piece 24 engage with the engagement depressed portions 21*f*2 and 21*f*3, respectively, of the reinforcing metal piece engagement part 21*f* in the connector housing 21 as shown in FIG. 8B, for example. Furthermore, the cover part 24*e* of the reinforcing metal piece 24 engages with the engagement protrusion 21*b*2 of the edge engagement portion 21*b*1 in the protruding fitting part 21*b* of the connector housing 21 by means of the groove 24*e*2 as shown in FIGS. 8A and 9, for example.

In the reinforcing metal piece 24, the cover part 24*e* has a width equivalent to the width, in the direction perpendicular to the row direction of the connection terminal rows 22*a* and 22*b* (the row width direction of the connection terminal rows 22*a* and 22*b*), of the protruding fitting part 21*b* at the both ends of the connection terminal rows 22*a* and 22*b*.

Thus, when the reinforcing metal pieces 24 are attached to the connector housing 21, such attachment is performed without the both ends of the protruding fitting part 21*b* projecting from the cover parts 24*e* of the reinforcing metal pieces 24 in the row width direction of the connection terminal rows 22*a* and 22*b* as shown in FIG. 7A, for example. FIG. 7A illustrates, by way of example, a configuration in which the width of the cover part 24*e* of the reinforcing metal piece 24 in the row width direction of the connection terminal rows 22*a* and 22*b*, and the width, in the same direction, of the protruding fitting part 21*b* at the both ends thereof are defined as D0, for example.

Figure 10:
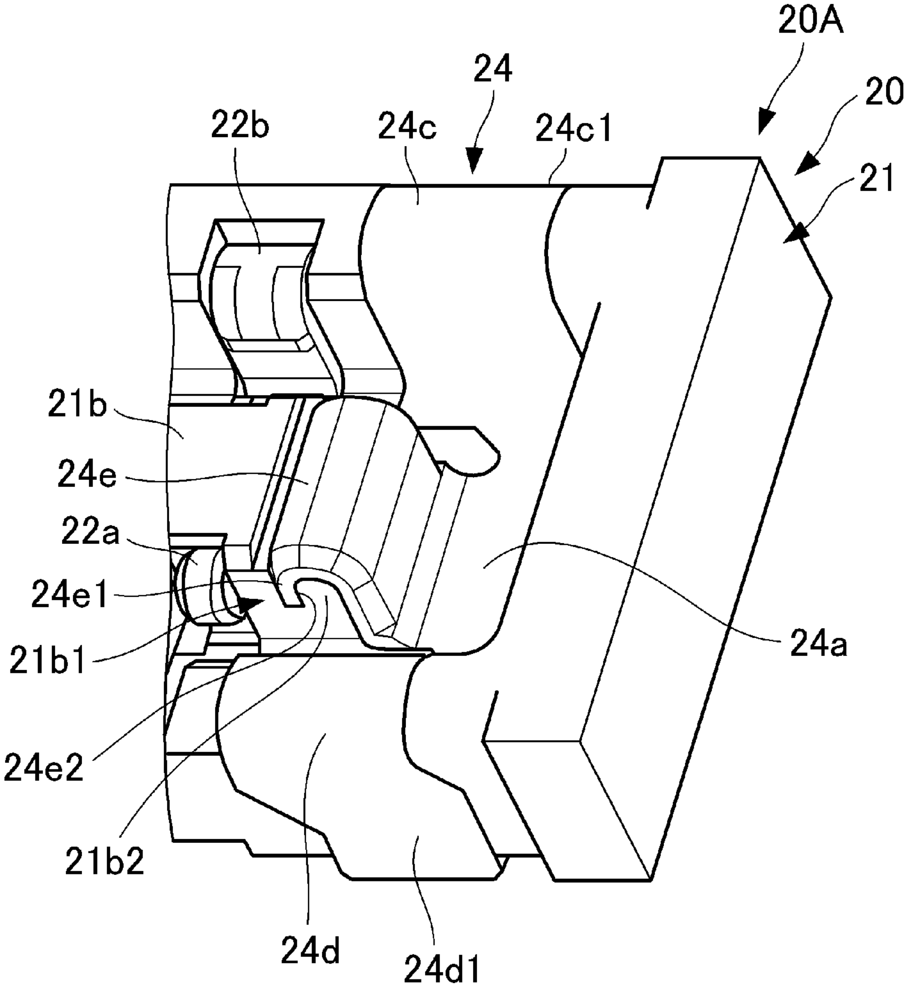
FIG. 10 is an enlarged perspective view illustrating a part of the vicinity of a position at which the reinforcing metal piece is attached in the electric connector (socket) according to the first embodiment of the present invention.

FIG. 10 is an enlarged perspective view illustrating a part of the vicinity of a position at which the reinforcing metal piece 24 is attached in the electric connector 20A of FIGS. 1, 2A, and 7A. As shown in FIG. 10, the cover parts 24*e* of the reinforcing metal pieces 24 in the electric connector 20A cover the both ends of the protruding fitting part 21*b* of the connector housing 21 in the row direction of the connection terminal rows 22*a* and 22*b*, entirely in the row width direction of the connection terminal rows 22*a* and 22*b*, from the upper surface side in the fit and removal direction (the Z direction in FIG. 1). In sum, the cover parts 24*e* of the reinforcing metal pieces 24 cover the entire end faces of the protruding fitting part 21*b* in the row direction of the connection terminal rows 22*a* and 22*b*.

The electric connector 20A having the above-described configuration and the counterpart electric connector 30A are capable of having a protrusion-depression fit (male-female coupling). As an operation for obtaining such a male-female coupling, the counterpart electric connector 30A is turned, with respect to the electric connector 20A having the disposition shown in FIG. 1, in the direction indicated by an arrow in FIG. 1 with the use of the attachment and detachment operation parts 31*e* (see FIG. 3B) so that the upper surface of the counterpart electric connector 30A faces the upper surface of the electric connector 20A. Thereafter, the electric connector 30A is further pushed into the electric connector 20A in the face-to-face direction so that the protruding fitting part 31*a* fits into the depressed fitting part 21*a* of the electric connector 20A. This provides a male-female coupling therebetween.

Upon the protrusion-depression fit according to the above-described procedure, an inner peripheral portion of the protruding fitting part 31*a* (an outer peripheral portion of the central depressed part 31*b*) in the counterpart electric connector 30A abuts against an outer peripheral portion of the protruding fitting part 21*b* provided inward of the depressed fitting part 21*a* in the electric connector 20A. As to the shorter-side direction (the X direction in FIG. 1) of the electric connector set 10, which has been assembled by the above-described protrusion-depression fit, corresponding ones of the connection terminals are in contact with each other between the connection terminal rows 22*a* and 22*b* in the depressed fitting part 21*a* of the electric connector 20A and the connection terminal rows 32*a* and 32*b* in the protruding fitting part 31*a* of the electric connector 30A, thus obtaining an electrically-connected state (conductible state).

At this time, as to the longitudinal direction (the Y direction in FIG. 1) of the electric connector set 10, the base parts 24*a* of the reinforcing metal pieces 24 attached to the vicinities of the both ends of the connector housing 21 of the electric connector 20A in the longitudinal direction (the Y direction in FIG. 1) make surface contact with upper surface portions of the reinforcing metal pieces 34 attached to the vicinities of the both ends of the connector housing 31 of the electric connector 30A in the longitudinal direction (the Y direction in FIG. 1), thus obtaining an electrically-connected state (conductible state) between the reinforcing metal pieces 24 and the reinforcing metal pieces 34.

In this manner, the electric connector set 10 has conductive paths between the connection terminal rows 22*a* and 22*b* and the connection terminal rows 32*a* and 32*b* and between the reinforcing metal pieces 24 and the reinforcing metal pieces 34. In the electric connector set 10 having such conductive paths, if an edge portion of the protruding fitting part 21*b* of the electric connector 20A is abraded during the fit or removal operation between the electric connector 20A and the electric connector 30A and insulating floating waste is thereby produced, such waste may interrupt the electrical conduction through the above-described conductive paths as mentioned also in the section of Technical Problem.

In the electric connector 20A according to the present embodiment, the reinforcing metal pieces 24 function to prevent the generation of the floating waste by covering, with the cover part 24*e*, the both ends of the protruding fitting part 21*b* located inward of the depressed fitting part 21*a* in the row direction of the connection terminal rows 22*a* and 22*b* during the aforementioned fit and removal operations.

A function to prevent the generation of the floating waste in the electric connector 20A according to the present embodiment will be described next.

According to the electric connector 20A of the present embodiment having the reinforcing metal pieces 24 in an attached state as shown in FIGS. 7A, and 8A to 10, one or both of the electric connector 20A and the counterpart electric connector 30A is or are pushed in in the face-to-face direction with the electric connector 20A facing the counterpart electric connector 30A as a result of turning the electric connector 30A in the direction indicated by the arrow in FIG. 1. This provides a protrusion-depression fit with the inner peripheral portion of the protruding fitting part 31*a* in the electric connector 30A being in contact with the outer periphery of the protruding fitting part 21*b* located inward of the depressed fitting part 21*a* in the electric connector 20A.

At this time, the both ends of the protruding fitting part 21*b* in the row direction of the connection terminal rows 22*a* and 22*b* are covered, entirely in the row width direction of the connection terminal rows 22*a* and 22*b*, by the cover parts 24*e* of the reinforcing metal pieces 24. This eliminates, in the electric connector 20A, the possibility that the outer periphery of the protruding fitting part 21*b* of the connector housing 21 in the electric connector 20A rubs against the inner peripheral portion of the protruding fitting part 31*a* (the central depressed part 31*b*) in the connector housing 31 of the electric connector 30A. Similarly, when the electric connector 30A is removed from the electric connector 20A in the above-described protrusion-depression fit state, the cover parts 24*e* also function to avoid contact with the inner peripheral portion of the protruding fitting part 31*a* (the central depressed part 31*b*) in the connector housing 31 of the electric connector 30A, thus preventing the occurrence of the aforementioned rubbing.

As just described, in the electric connector 20A according to the present embodiment, the cover parts 24*e* of the reinforcing metal pieces 24 function to avoid, at the ends of the protruding fitting part 21*b* in the row direction of the connection terminal rows 22*a* and 22*b*, interference by the counterpart protruding fitting part 31*a* in the connector housing 31 of the counterpart electric connector 30A from the row width direction of the connection terminal rows 22*a* and 22*b* when the counterpart electric connector 30A is fitted into, or removed from, the electric connector 20A. This can prevent the generation of floating waste due to the abrasion of an edge of the protruding fitting part 21*b* even when the fit and removal operations between the electric connector 20A and the electric connector 30A are repeated, and can also reduce a risk of contact failure significantly.

In the present embodiment, the length (width) of the cover part 24e of the reinforcing metal piece 24 in the row width direction of the connection terminal rows 22a and 22b is equivalent to the width, in the same direction, of the protruding fitting part 21b at the both ends thereof. The present invention, however, is not limited thereto. The aforementioned width of the cover part 24e may be in a predetermined width range equivalent to, or exceeding, the width, in the row width direction of the connection terminal rows 22a and 22b, of the protruding fitting part 21b at the both ends thereof. Accordingly, in the electric connector 20A employing the reinforcing metal pieces 24 including the cover parts 24e each having a predetermined width exceeding the width in the direction perpendicular to the row direction of the connection terminal rows 22a and 22b, for example, the cover parts 24e of the reinforcing metal pieces 24 can ensure, when the counterpart electric connector 30A is fitted into, or removed from, the electric connector 20A, a clearance (margin) between side edges, in the row width direction of the connection terminal rows 22a and 22b, of the protruding fitting part 21b at the ends thereof and side edges of the counterpart protruding fitting part 31a of the counterpart electric connector 30A in the same direction. Thus, the protruding fitting part 21b and the counterpart protruding fitting part 31a become further less likely to interfere with each other.

The present embodiment gives the example in which the two reinforcing metal pieces 24 are provided, and the reinforcing metal pieces 24 are attached to the connector housing 21 at the both ends of the connector housing 21 in the row direction of the connection terminal rows 22a and 22b. The present embodiment, however, is not necessarily limited to those having the two reinforcing metal pieces 24. For example, the reinforcing metal piece 24 may be attached to the connector housing 21 at either one of the both ends of the connector housing 21 in the row direction of the connection terminal rows 22a and 22b. Moreover, the attachment position of the reinforcing metal piece 24 in the connector housing 21 in the present embodiment is not limited to the end of the connector housing 21 in the row direction of the connection terminal rows 22a and 22b. The reinforcing metal piece 24 may be provided at any position in such a row direction.

As described above, the electric connector 20A according to the present embodiment includes: the insulating connector housing 21; the conductive connection terminal rows 22a and 22b provided in the connector housing 21; and the reinforcing metal pieces 24 attached to the connector housing 21. By means of a fit between the electric connector 20A and the counterpart electric connector 30A, the connection terminal rows 22a and 22b are electrically connected to the connection terminal rows (counterpart connection terminal rows) 32a and 32b of the counterpart electric connector 30A.

In this electric connector 20A, the connector housing 21 includes: the depressed fitting part 21a provided in a ring shape on one side of the connector housing 21; and the protruding fitting part 21b provided inward of the depressed fitting part 21a as the protruding fitting part. The depressed fitting part 21a and the protruding fitting part 21b are capable of having protrusion-depression fits with the protruding fitting part (counterpart protruding fitting part) 31a provided in a ring shape on one side of the connector housing (counterpart housing) 31 of the counterpart electric connector 30A and the central depressed part 31b (counterpart depressed fitting part) provided inward of the protruding fitting part 31a, respectively. The reinforcing metal pieces 24 include the cover parts 24e for covering the ends of the protruding fitting part 21b from their upper surface side in the protrusion-depression fit direction (the Z direction in FIG. 1) over a width range equivalent to, or exceeding, the width, in the direction perpendicular to the row direction of the connection terminal rows 22a and 22b, of the protruding fitting part 21b at the ends thereof.

With such a configuration, the cover parts 24e of the reinforcing metal pieces 24 in the electric connector 20A of the present embodiment function to avoid, at the ends of the protruding fitting part 21b, the interference of the protruding fitting part 31a, which is caused by the counterpart connector housing 31, from the upper surface side and the width direction of the protruding fitting part 21b when the counterpart electric connector 30A is fitted into, or removed from, the electric connector 20A. This can prevent the generation of floating waste due to the abrasion of an edge of the protruding fitting part 21b in the connector housing 21 even when the fit and removal operations are repeated. A reduction in generated floating waste can reduce an amount of floating waste intruding into between the connection terminal rows 22a and 22b and the counterpart connection terminal rows 32a and 32b and between the reinforcing metal pieces 24 and the counterpart reinforcing metal pieces 34, for example, which form the conductive paths. Thus, a risk of contact failure in the conductive paths can be significantly reduced.

In the electric connector 20A according to the present embodiment, the cover parts 24e of the reinforcing metal pieces 24 are configured to cover the entire end faces of the protruding fitting part 21b in the row direction of the connection terminal rows 22a and 22b.

With such a configuration, the electric connector 20A according to the present embodiment can more reliably prevent the interference of the counterpart protruding fitting part 31a against the protruding fitting part 21b by the connector housing 31 of the counterpart electric connector 30A when the counterpart electric connector 30A is fitted into, or removed from, the electric connector 20A as compared to a configuration in which only portions of the end faces of the protruding fitting part 21b in the row direction of the connection terminal rows 22a and 22b are covered by the cover parts 24e of the reinforcing metal pieces 24. This can make the generation of the floating waste and the contact failure less likely to occur.

The electric connector 20A according to the present embodiment is configured in such a manner that: the connection terminals include the plurality of connection terminal rows 22a and 22b arranged approximately in the same plane in the connector housing 21; the reinforcing metal pieces 24 are attached to the connector housing 21 at both ends of the connector housing 21 in the row direction of the connection terminal rows 22a and 22b; and the both ends of the protruding fitting part 21b in the row direction of the connection terminal rows 22a and 22b are covered with the cover parts 24e.

With such a configuration, regardless of from which side of the both ends of the counterpart protruding fitting part 31a of the counterpart electric connector 30A the fit or removal operation is started first, the electric connector 20A according to the present embodiment can avoid the interference of the counterpart protruding fitting part 31a against the both ends of the protruding fitting part 21b by means of the cover part 24e of the reinforcing metal piece 24 provided on each side, thus preventing the generation of the floating waste.

The electric connector set 10 according to the present embodiment is configured to include the aforementioned electric connector 20A with the reinforcing metal pieces 24 having the cover parts 24*e* attached thereto and the counterpart electric connector 30A having the aforementioned configuration.

With such a configuration of the electric connector set 10 according to the present embodiment, the cover parts 24*e* of the reinforcing metal pieces 24 in the electric connector 20A capable of having protrusion-depression engagement with the counterpart electric connector 30A function to avoid the interference of the counterpart protruding fitting part 31*a*, which is caused by the connector housing 31 of the counterpart electric connector 30A, against the protruding fitting part 21*b* from its upper surface side and the row width direction of the connection terminal rows 22*a* and 22*b* when the counterpart electric connector 30A is fitted into, or removed from, the electric connector 20A. This can prevent the generation of floating waste due to the abrasion of an edge of the protruding fitting part 21*b* in the connector housing 21 even when the fit and removal operations are repeated, and can also significantly reduce a risk of contact failure due to the intrusion of the floating waste into the conductive paths.

Second Embodiment

An electric connector 20B according to the present embodiment has main elements identical with or similar to those of the aforementioned first embodiment. Thus, elements similar to those in the first embodiment will be denoted by the same reference numerals, and aspects different from the first embodiment will be described in the following description.

Figure 11:
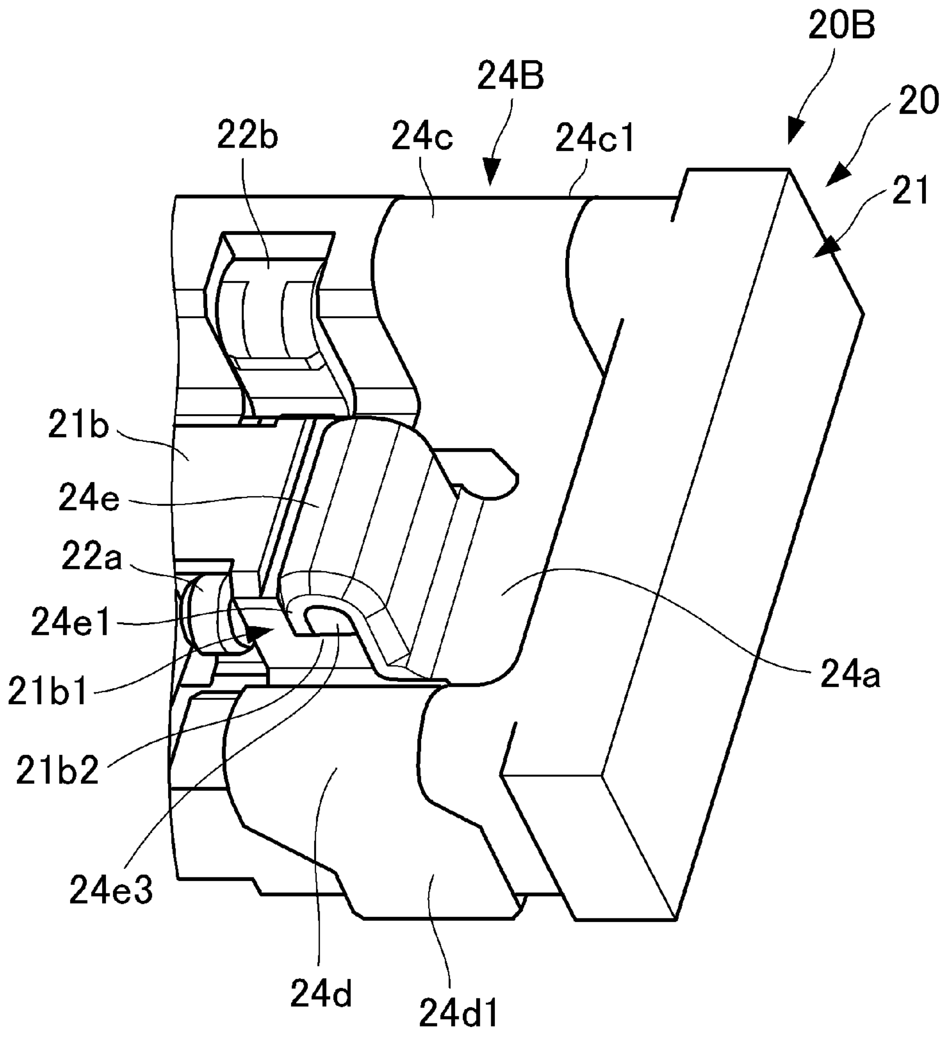
FIG. 11 is an enlarged perspective view illustrating a part of the vicinity of a position at which the reinforcing metal piece is attached in the electric connector (socket) according to a second embodiment of the present invention.
Figure 12A:
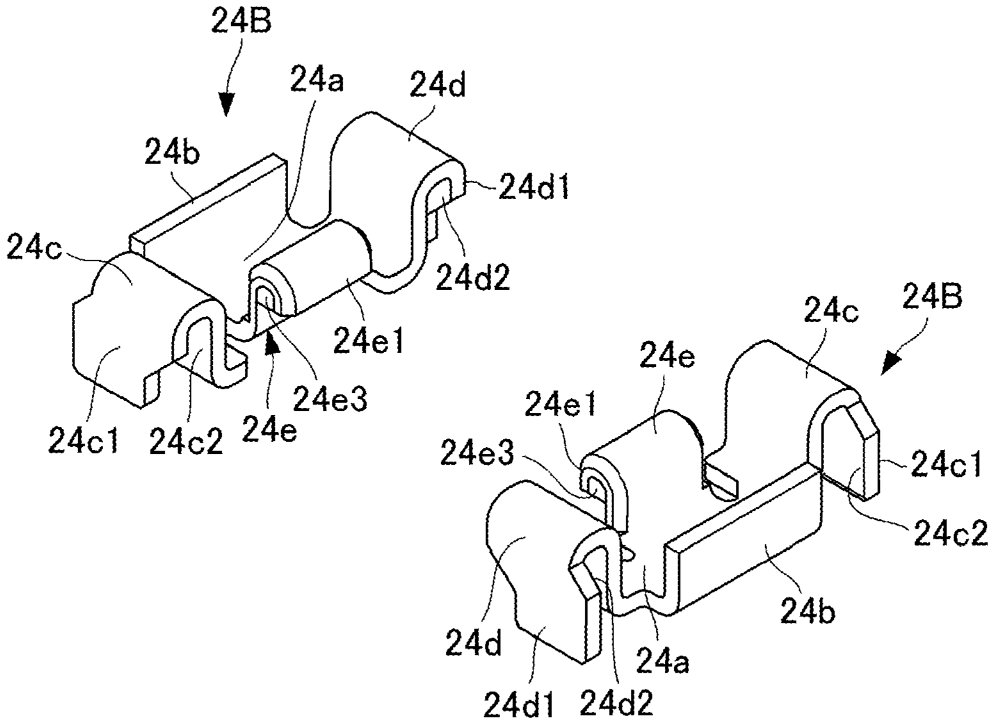
FIG. 12A is a perspective view of the reinforcing metal pieces to be attached to the connector housing in the electric connector (socket) according to the second embodiment of the present invention, showing the exterior of its upper surface side.
Figure 12B:
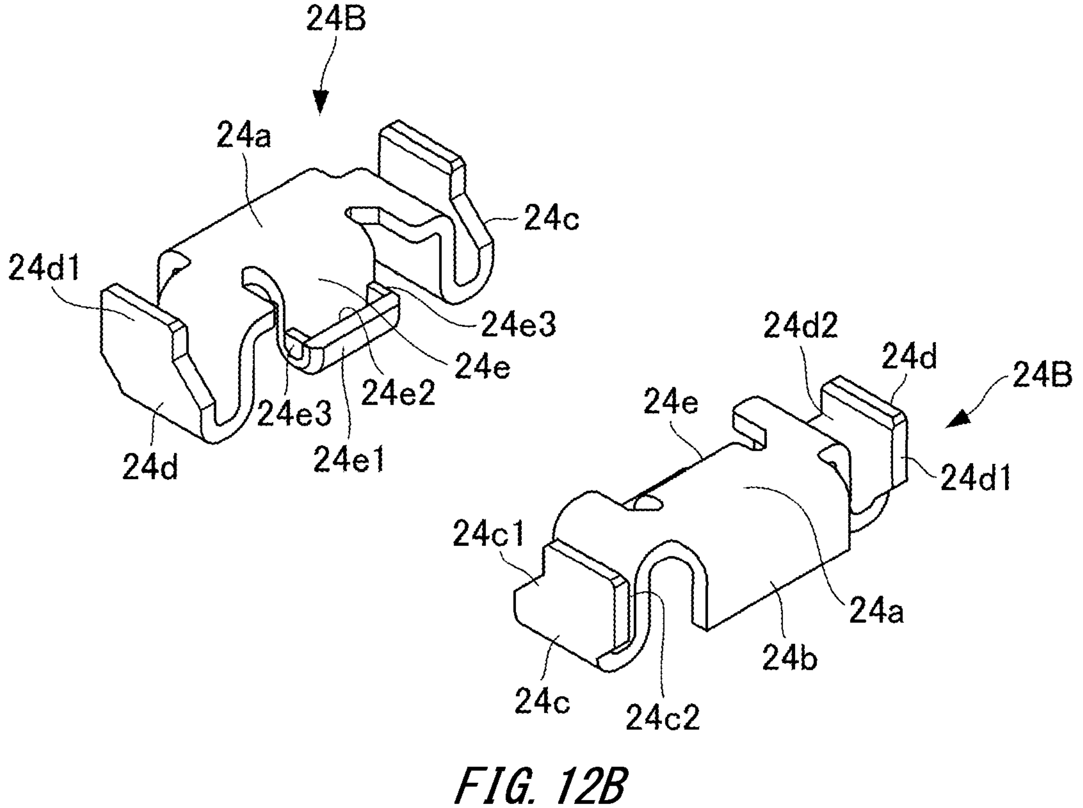
FIG. 12B is a perspective view of the reinforcing metal pieces to be attached to the connector housing in the electric connector (socket) according to the second embodiment of the present invention, showing the exterior of its lower surface side.

FIG. 11 is an enlarged perspective view illustrating a part of the vicinity of a position at which a reinforcing metal piece 24B of the electric connector 20B according to the second embodiment of the present invention is attached. FIGS. 12A and 12B are perspective views showing the reinforcing metal pieces 24B to be attached to a connector housing 21 of the electric connector 20B.

In the electric connector 20B according to the present embodiment, the reinforcing metal piece 24B to be attached to the connector housing 21 includes a cover part 24*e* having a structure different from that in the first embodiment. As shown in FIGS. 11, 12A and 12B, the reinforcing metal piece 24B according to the present embodiment further includes, in addition to the cover part 24*e*, side cover portions 24*e*3 provided so as to block both side edges of a groove 24*e*2 of the cover part 24*e*.

In the reinforcing metal piece 24B, the side cover portions 24*e*3 are provided so as not to project from the cover part 24*e* in a row width direction of connection terminal rows 22*a* and 22*b* and so as to edge into the groove 24*e*2 from the both sides thereof in the above-described row width direction (see FIG. 12B). In the electric connector 20B, on the other hand, an engagement protrusion 21*b*2 in an edge engagement portion 21*b*1 of the connector housing 21 has a width smaller than a width of the groove 24*e*2 of the reinforcing metal piece 24B in the row width direction of the connection terminal rows 22*a* and 22*b*. This allows the reinforcing metal piece 24B to be attached to the connector housing 21 in such a manner that the side cover portions 24*e*3 form flat surfaces with side end faces of the cover part 24*e* in the row width direction of the connection terminal rows 22*a* and 22*b* as shown in FIG. 11.

As shown in FIG. 11, the reinforcing metal pieces 24B are attached in the electric connector 20B in such a manner that the cover parts 24*e* cover both ends of a protruding fitting part 21*b* in a row direction of the connection terminal rows 22*a* and 22*b* from their upper surface side over entire regions of the both ends in the row width direction of the connection terminal rows 22*a* and 22*b* and the side cover portions 24*e*3 cover the protruding fitting part 21*b* from its side surface side in the row width direction of the connection terminal rows 22*a* and 22*b*.

At this time, the side cover portions 24*e*3 of the reinforcing metal piece 24B form flat surfaces with the side end faces of the cover part 24*e* in the row width direction of the connection terminal rows 22*a* and 22*b* (not protruding from the side end faces). Thus, an operation of fitting a protruding fitting part 31*a* of a counterpart electric connector 30A into a depressed fitting part 21*a* of the electric connector 20B is uninterrupted. As just described, the reinforcing metal piece 24B further includes the side cover portions 24*e*3 extending from the cover part 24*e* so as to cover the side surfaces of the end of the protruding fitting part 21*b*.

With such a configuration, the electric connector 20B according to the present embodiment can avoid, by means of the cover parts 24*e* and the side cover portions 24*e*3 of the reinforcing metal pieces 24B, the interference of the counterpart protruding fitting part 31*a* of the counterpart connector housing 21 against the protruding fitting part 21*b* from its upper surface side and its side surfaces in the row width direction of the connection terminal rows 22*a* and 22*b* when the counterpart electric connector 30A is fitted into, or removed from, the electric connector 20B. Consequently, the abrasion of an edge of the protruding fitting part 21*b* in the connector housing 21 due to the repeated fit and removal operations can be prevented from occurring more reliably, and a risk of contact failure can be further reduced.

Note that the present embodiment is also not limited to those having the two reinforcing metal pieces 24B. Needless to say, the present embodiment can be modified to have, for example, a configuration in which the reinforcing metal piece 24B is provided only at either one of the both ends in the row direction of the connection terminal rows 22*a* and 22*b* or a configuration in which the reinforcing metal piece 24B is provided at any position in such a row direction.

As described above, the embodiments of the present invention can provide the electric connector and the electric connector set capable of avoiding the abrasion of the connector housing due to the repeated fit and removal operations with the counterpart connector and capable of preventing contact failure resulting from floating waste generated by the abrasion of the connector housing. The present invention is useful for electric connectors in general including a socket to be mounted on a circuit substrate and a plug capable of having protrusion-depression engagement with the socket.

REFERENCE SIGNS LIST

10 electric connector set
20A, 20B electric connector
21 connector housing
21*a* depressed fitting part
21*b* protruding fitting part
21*b*1 edge engagement portion
21*f* reinforcing metal piece engagement part
22*a*, 22*b* connection terminal row
24, 24B reinforcing metal piece
24*e* cover part
24*e*3 side cover portion
30A electric connector
31 connector housing
31*a* protruding fitting part

31*b* central depressed part

32*a*, 32*b* connection terminal row

The invention claimed is:

1. An electric connector comprising: an insulating housing; a conductive connection terminal row provided in the housing; and a reinforcing metal piece attached to the housing, the electronic connector being configured such that, by means of a fit between the electric connector and a counterpart connector, the connection terminal row is electrically connected to a counterpart connection terminal row, wherein the housing includes: a depressed fitting part provided in a ring shape on one side of the housing; and a protruding fitting part provided inward of the depressed fitting part, the depressed fitting part and the protruding fitting part are capable of having protrusion-depression fits with a counterpart protruding fitting part provided in a ring shape on one side of a counterpart housing of the counterpart connector and a counterpart depressed fitting part provided inward of the counterpart protruding fitting part, respectively, and the reinforcing metal piece includes a cover part for covering an end of the protruding fitting part from an upper surface side thereof in a direction of the protrusion-depression fits over a width range equivalent to, or exceeding, a width, in a direction perpendicular to a row direction of the connection terminal row, of the protruding fitting part at the end thereof.

2. The electric connector according to claim 1, wherein the reinforcing metal piece further includes a side cover portion extending from the cover part so as to cover a side surface of the end of the protruding fitting part.

3. The electric connector according to claim 1, wherein the cover part of the reinforcing metal piece is configured to cover an entire end face of the protruding fitting part in the row direction of the connection terminal row.

4. The electric connector according to claim 1, wherein a plurality of connection terminal rows are arranged approximately in a same plane in the housing, the reinforcing metal piece is attached to the housing at each of both ends of the housing in the row direction of the connection terminal row; and each of both ends of the protruding fitting part in the row direction of the connection terminal row is covered with the cover part.

5. An electric connector set comprising the electric connector according to claim 1, and the counterpart connector.

6. The electric connector according to claim 1, wherein the depressed fitting part is a ring-shaped groove formed in the housing on an upper surface side thereof.

7. The electric connector according to claim 1, wherein the protruding fitting part protrudes from a surface of the housing on which the depressed fitting part is provided, and has rows of terminal insertion parts into which the connection terminal row is fitted.

* * * * *